United States Patent

Ashar et al.

[11] Patent Number: 5,937,183
[45] Date of Patent: Aug. 10, 1999

[54] ENHANCED BINARY DECISION DIAGRAM-BASED FUNCTIONAL SIMULATION

[75] Inventors: Pranav N. Ashar; Sharad Malik, both of Princeton, N.J.

[73] Assignee: NEC USA, Inc., Princeton, N.J.

[21] Appl. No.: 08/743,804

[22] Filed: Nov. 5, 1996

[51] Int. Cl.[6] .................................................. G06F 9/455
[52] U.S. Cl. .............................. 395/500.34; 395/500.43; 395/500.36
[58] Field of Search ............................ 395/500; 364/489, 364/490, 491, 488

[56] References Cited

U.S. PATENT DOCUMENTS 5,493,508   2/1996   Dangelo et al. ........................ 364/489
5,574,893   11/1996  Southgate et al. ..................... 395/500

OTHER PUBLICATIONS

Leiserson, et al. "Retiming Synchronous Circuitry", Algorithmica—An International Journal in Computer Science, vol. 6, No. 1, 1991, Special Issue, Algorithmic Aspects of VLSI Design, pp. 5–35.

Ashar, et al. "Fast Functional Simulation Using Branching Programs", Proceedings of the International Conference on Computer–Aided Design, pp. 408–412, Nov. 1995.

McGeer, et al. "Fast Discrete Function Evaluation Using Decision Diagrams", Proceedings of the International Conference on Computer–Aided Design, pp. 402–407, Nov. 1995.

Richard Rudell "Dynamic Variable Ordering for Ordered Binary Decision Diagrams", Proceedings of the International Conference on Computer–Aided Design, Nov. 1993.

*Primary Examiner*—Kevin J. Teska
*Assistant Examiner*—Thuan Do
*Attorney, Agent, or Firm*—Sughrue, Mion, Zinn, Macpeak & Seas, PLLC

[57] ABSTRACT

In compiled code simulation, a circuit to be simulated is converted or compiled into an executable so that running the executable produces the same output response as the circuit itself. In a binary decision diagram (BDD)-based compiled code simulator, the simulation executable for the circuit is derived from a BDD-based characteristic function representation of the circuit rather than by the heretofore used translation of Boolean operations in the original circuit into machine instructions.

21 Claims, 3 Drawing Sheets

FIG. 1
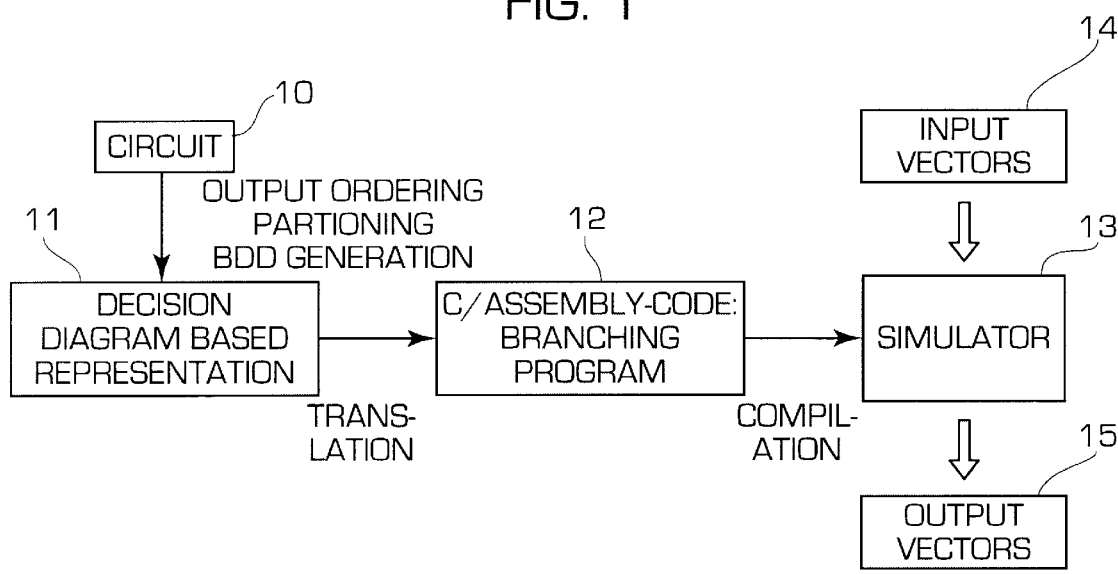
FIG. 2
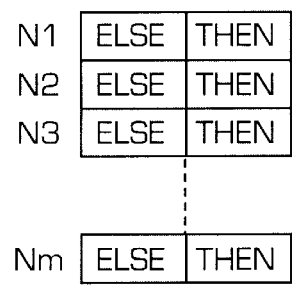
FIG. 3
IF (x1) GOTO V1;
  ELSE GOTO V2;
V1: IF (x2) RETURN 1;
  ELSE GOTO V2;
V2: IF (x3) RETURN 1;
  ELSE RETURN 0;

FIG. 4(a)

tst %r1
be, a L_ELSE
ldub [%g1 + ELSE_AI], %r1
b L_THEN
ldub [%g1 + THEN_AI], %r1

FIG. 4(b)

tst %r1
bne L_THEN
ldub [%g1 + THEN_AI]

FIG. 4(c)

b L_NEXT
stb %g0, [%g1 + NEXT_AI]

FIG. 4(d)

stb %g0, [%g1 + NEXT_AI]

```
.global _sub_ckt_0
_sub_ckt_0:
save%sp, -64, %sp
mov 1, %l0
sethi %hi(_g+4096+0), %g1
or %g1, %lo(_g), %g1
L10:
ldub [%g1+(-4096)], %l1
tst %l1
be, a L12
ldub [%g1+(-4095)], %l1
stb %l0, [%g1+(-4092)]
L11:
b LE27
nop
L12:
tst %l1
bne, a L11
stb %l0, [%g1+(-4092)]
ldub [%g1+(-4094)], %l1
L13:
tst%l1
bne, a L11
stb %l0, [%g1+(-4092)]
ldub [%g1+(-4093)], %l1
L14:
tst %l1
bne, a L11
stb %l0, [%g1+(-4092)]
stb %g0, [%g1+(-4092)]
L15:
b LE27
nop
LE27:
ret
restore
```

FIG. 5

ENHANCED BINARY DECISION DIAGRAM-BASED FUNCTIONAL SIMULATION

FIELD OF INVENTION

The present invention relates to binary decision diagram-based characteristic function representation of a circuit to be simulated. Specifically, the invention concerns assembly code generation methods for increasing speed and decreasing memory utilization in BDD-based functional simulation.

BACKGROUND OF THE INVENTION

In complied code simulation, the circuit to be simulated is converted (compiled) into an executable so that running this executable produces the same output response as the circuit without having to fabricate the circuit itself. This approach results in very fast delay-independent functional simulation (pure Boolean equation evaluation). In (Binary Decision Diagram) BDD-based compiled code simulation, the simulation executable for the circuit is derived from a BDD-based characteristic function representation of the circuit rather than from the conventional approach (called levelized compiled code simulation) of a straightforward translation of Boolean operations in the original circuit to machine instructions. Deriving the executable in this manner has been shown to result in significant speed up over the conventional approach. The speed up of delay-independent (i.e. purely functional) cycle-based logic simulation of synchronous digital circuits using BDD-based characteristic functions has been proposed in a recent article by P. Ashar and S. Malik entitled "Fast Functional Simulation Using Branching Programs" in the Proceedings of the International Conference on Computer-Aided Design, pages 408–412, November 1995 and in an article by P. McGeer, et al. entitled "Fast Discrete Function Evaluation Using Decision Diagrams" in the Proceedings of the International Conference on Computer-Aided Design, pages 402–407, November 1995. These prior art methods require that the BDD representation first be generated in C-code and then compiling the C-code to obtain assembly code.

The efficient representation and manipulation of Boolean functions is important in many applications. In particular, many problems in computer-aided design for digital circuits (CAD) can be expressed as a sequence of operations performed over a set of Boolean functions. Typical CAD applications include combinational logic verification, sequential-machine equivalence, logic optimization of combinatorial circuits, text sorting generation, timing verification in the presence of false paths, and symbolic simulation.

A binary decision diagram (BDD) is a directed acyclic graph (DAG). The graph has two sink nodes labeled 0 or 1 representing the Boolean functions 0 and 1. Each non-sink node is labeled with a Boolean variable v and has two out-edges labeled 1 (or then) and 0 (or else). Each non-sink node represents the Boolean function corresponding to its 1 edge if v=1, or the Boolean function corresponding to its 0 edge if v=0. Methods for generating BDD representations of circuits and were known in the art. One such method is described in U.S. patent application Ser. No. 08/331,075 by Ashar and Cheong, entitled "Breadth-First Manipulation Binary Decision Diagram" and assigned to the same assignee as the present invention and incorporated herein by reference.

There are two fundamental methods of generating assembly code for two-valued simulation using BDD-based characteristic functions where the BDD-based characteristic function is an executable.

One method will be referred to as the "data-centric" approach. In this approach, the BDD is stored as data in memory and a simple for loop traverses the BDD data to determine the output value. The obvious way of storing the BDD is as the 2-dimensional array. Each row corresponds to a BDD node, and each element of the array contains the address of a child node. Depending on the value of the input variable, the address of the next BDD node is determined as the content of the current address or the content of the current address incremented by one. A feature of this approach is that only 8 bytes (two 32 bit words) of storage is required per BDD node. This is the approach used in McGeer, et al. supra.

Another method of implementing the executable is to translate the BDD-based characteristic function directly into an if-then-else program. This approach will be referred to as the "instruction-centric" approach. The present invention is based on this latter approach. Using cc and gcc to compile the C-code generated from large BDDs can take an inordinately long time, especially when optimization options are used. To avoid this problem, it is necessary to generate optimized assembly code directly from the BDDs. That is a primary object of the invention.

SUMMARY OF THE INVENTION

The present invention improves the efficiency of BDD-based characteristic functions used for Boolean equation evaluation.

In accordance with the teachings of the present invention, assembly code is generated directly for typical RISC processors. In prior art methods, first C-code is generated which is then compiled, using compiler software, to generate assembly code. The direct generation of assembly code speeds the process significantly.

One result of the invention is that in order to maximize simulation speed using BDD-based simulation, certain circuit partitioning, as described below, becomes evident.

A principal object of the present invention is the provision of a process of generating assembly code directly or indirectly from the BDD of a single output function or a BDD-based characteristic function of a multiple output function for the purpose of functional simulation where each BDD node corresponding to an input variable is translated to a sequence of machine instructions that perform the function of fetching the input variable value, and testing the fetched value, branching to the code for the appropriate child node depending on the fetched value.

Another object of the invention is a process of generating assembly code directly or indirectly from the BDD of a single output function or a BDD-based characteristic function of a multiple output function for the purpose of functional simulation where each BDD node corresponding to an output variable is translated to a sequence of machine instructions that perform the function of storing the output variable value and branching to the code for the next BDD node.

Other objects of the invention include the provision of I/O variable values stored in a global data structure like an array, a of register being dedicated to storing the base address of the array. Multiple registers may be required if multiple arrays are used or if the array size exceeds a threshold. The provision of loading (storing) of input (output) variables may be performed by a single instruction using the base address stored in a register. The load/store instruction for a node is placed in the delay slot of a branch leading to the code for that node. The array index of the variable corresponding to the code to branch to is determined at compile time.

Variations and modifications of these objects including the process of generating code as described above where arbitrary variable ordering in different partitions, non-contiguous variable IDs for successive nodes in the BDDs, interleaving of inputs and outputs, the output of one partition to be the input of another partition are all allowed without run time overhead by virtue of the determination of the array index of the next variable at compile time.

Also, the code for a child node may be emitted contiguous with the current node when possible so that the need for one of the branches is obviated. Alternatively, emitting the code for one of the child nodes contiguously in the above manner where, if there is a choice of which child node to emit contiguously, the child node picked is the one that corresponds to the value taken most often by the variable.

It is also possible to modify already existing code generated in the above manner where the placement of nodes is changed to reflect input vector data.

Another object of the invention is the provision of a process of using dynamic variable ordering in the creation of BDDs from which assembly code is generated where variables are allowed to move up and down the variable order according to the sifting algorithm (and its variations) of Rudell except when the pair to be swapped corresponds to an output variable and an input variable in its support.

Further objects of the invention include: the provision of a process of partitioning the design and ordering the evaluation of the partitions for increasing the speed and reducing the memory requirements of BDD-based simulation, where, blocks of logic with disjoint support are placed in separate partitions and a partition is evaluated only when necessary. Alternatively, blocks of logic with widely differing frequencies of use are placed in separate partitions and a partition is evaluated only when necessary. A further alternative logic includes generating blocks of such that either one or the other of the two blocks is needed, but never both, and the block of logic that determines which of the two blocks is needed is placed in separate partitions. This activation also applies to the case where more than two blocks are mutually exclusive.

Further and still other objects of the present invention will become more clearly apparent when the following description is read in conjunction with the accompanying drawing.

BRIEF DESCRIPTION OF THE DRAWINGS

FIG. 1 is a schematic block diagram of a prior art method of speeding up delay-independent cyclic-based logic simulation of synchronous digital circuits using BDD-based characteristic functions;

FIG. 2 is a schematic representation of storing a BDD in a two-dimensional array format;

FIG. 3 is an if-then-else program illustrating an instruction centric approach method of implementing an executable;

FIGS. 4(a)–4(d) are assembly code fragments for instruction-centric methods of enhancing BDD-based functional simulations; and FIG. 5 is assembly code for a simple function f=a+b+c+d.

DETAILED DESCRIPTION

Referring now to the figures, and FIG. 1 in particular, there is shown a schematic block diagram of a prior art method of speeding up delay independent cyclic-based logic simulation of synchronous digital circuits using BDD-based characteristic functions.

A circuit 10 to be simulated undergoes conventional output ordering, partitioning and BDD generation after which a decision diagram based representation is generated 11. The BDD representation is translated into C/assembly code 12 and then compiled into an executable 13. The executable is run by applying input vectors 14 and monitoring output vector 15 so that circuit response of the circuit 10 can be simulated without fabricating an actual circuit.

As described above, the data-centric approach to generating the executable stores the BDD as a two-dimensional array as shown in FIG. 2 where each row corresponds to a BDD mode Ni and each element of the array contains the address of a child node.

In the instruction-centric approach described above, the BDD-based characteristic function is translated directly into an if-then-else program as shown in FIG. 3.

The following are details of the assembly code generated in an instruction-centric approach for a SPARC processor. The input to the code generator is the BDD-based characteristic function and the output is SPARC compatible optimized assembly code. The same technique for optimized code generation can be used for other RISC processors also. The optimized code maximally utilizes delay-slots and registers, and maximizes straight-line code. The code for each partition is generated separately. The procedure corresponding to each partition is called in the correct statically determined order by a top-level routine.

The BDD for the characteristic function has two types of nodes—nodes corresponding to input variables and nodes corresponding to output variables. When an input node is encountered, the value of the input variable must be read from memory and based on the value, the appropriate branch must be taken. When an output node is encountered, the value computed for the output variable must be stored in memory. The code generator traverses the BDD in a depth-first manner, emitting the appropriate code for the nodes encountered along the way. It is possible to determine at code generation time whether a node is an output or an input node.

The input and output variable values are stored in a single array in memory. Each variable has an array index associated with it by means of which its value can either be obtained from the array or can be stored in it. The smallest entity that can be loaded and stored on a SPARC is a byte. Therefore, the array of variables is an array of bytes. In order to avoid mask and shift instructions, a byte is used for each variable rather than loading eight variables into each byte. The SPARC provides a register-indirect with immediate offset addressing mode for the load byte instruction of the form Ldub [rs1+op2], rd whose operation is defined as r[rd]=memory [r[rs1]+op2]. op2 is a signed 13-bit immediate offset. Similarly, a store byte instruction of the form stb rd, [rs1+op2] is also available. Using this addressing mode, variable values can be loaded and stored in a single instruction as follows. With the 13-bt signed immediate offset, the offset can lie between −4096 and 4095. Assuming that the number of variables is less than 8193, it is possible to dedicate a register to hold the constant 4096 (register g1 in the Ldub instruction in FIG. 4(a)) and access all the other variables using the immediate offset. When there are more than 8192 variables, additional registers are dedicated to hold constants. Since the loads and stores are done in single instructions, they can be placed in the delay slots of branches as shown for the Ldub instructions in FIG. 4(a).

Code fragments for input nodes are shown in FIGS. 4(a) and 4(b). The program arrives at the code fragment of an input node as the result of a branch. The value of the input variable is loaded into the register r1 by means of an Ldub instruction as stated above. Thus, the first task on arriving at a node is to test if its value is 0 by means of the tst %r1 instruction. If both the else and the then children have been seen before, it means that the code for both children has already been emitted and the program only has to branch to the proper location. This is done using the be, a L_ELSE and b L_THEN instructions in FIG. 4(a). Notice that the delay slots of both the branches are filled with Ldub instructions to load the values of the input variables corresponding to the nodes being jumped to. This is possible since we know the identities and therefore the array indices (ELSE_AI and THEN_AI) of the variables corresponding to the children nodes at code generation time. If the child node being jumped to is an output node, there would be an stb instruction in the delay slot of the Ldub instruction. Given 4 bytes per instruction for the SPARC, the 5 instructions in FIG. 4(a) mean that 20 bytes are required per input node, in the worst case, in the emitted code. The run time overhead is either 2 or 3 instructions depending on whether the first or the second branch is taken. This is the worst case because it is possible that either the else or the then child has not been seen before and therefore its code has not yet been emitted. If the code for a child node has not been emitted, it is possible to ensure that it is not necessary to branch to it by emitting its code right after the current input node. An example is shown in FIG. 4(b). The code for the then child has already been emitted, but the code for the else child has not. If the code for the else child is emitted right below the code for the current input node, we need the branch for only the then child as shown in the example. The 3 instructions here imply a 12 byte memory overhead and a run time overhead of 2 instructions. This is in fact the typical case in a BDD and one can expect the memory requirement to be closer to 12 rather than 20 bytes per input node. There is also the case where neither of the two children of a node have been encountered before. In that case we have the choice of either branching to the else child or branching to the then child. Any information obtained from the input vector set can be used to make the choice. For example, if an input is known to predominantly take the value 0 (eg. a reset line), the choice would be to branch to the then child in order to minimize the number of branches.

Code fragments for output nodes are shown in FIGS. 4(c) and 4(d). The output value is stored in the variable array by means of an stb instruction in the delay slot of the branch used to arrive at the current output node. Thus, the only task that an output node needs to perform is to jump to its child node. An output node has only one non-zero child node, therefore a conditional branch is not needed. The delay slot of the branch is filled with either an Ldub or an stb instruction depending on whether the child node is an input or output node. Thus, the two instructions required in the worst case for an output node represent an 8 byte memory overhead and a 1 instruction run time overhead (FIG. 4(c)). This is the worst case because, if the child node has not been encountered before, its code can be emitted right below the current input node, eliminating the need for the branch. In that case only an Ldub or stb instruction is required, implying a memory overhead of 1 byte and a run time overhead of 1 instruction.

The following features of the instruction-centric method make it attractive: (1) Since a node is detected to be an output or input node at code generation time, it is possible to interleave input and output variables with no run time overhead. (2) Since the output and input variables are stored in the same array, the output of one partition can be the input of another partition with no overhead. Basically, the interpretation of a variable can be different in different partitions. (3) Since the identity of the node variable is detected at code generation time, it is possible allow for successive nodes in the BDD not having successive variable ids with no run time overhead. (4) For the same reason, it is possible to allow for a different variable ordering per partitioning with no overhead. Therefore, the run time overhead of the method is one, two or three instructions per encountered BDD node depending on the type of node.

We have implemented dynamic variable ordering in our BDD-based simulation framework. It was suggested in an article by R. Rudell entitled "Dynamic Variable Ordering for Ordered Binary Decision Diagrams" in Proceeds of the International Conference on Computer-Aided-Design, pages 42–47, November 1993 that dynamic variable ordering, i.e. reordering the variables while building the BDDs, can be used to reduce BDD sizes. In the Rudell article, it was shown to work well for a large number of circuits. In fact, it was demonstrated that for many circuits for which heuristically obtained variable orders result in unmanageable BDD sizes, dynamic variable ordering was able to produce very small BDDs. The enabling innovation in that work was to demonstrate that exchanging the positions of two adjacent levels in the BDD has a run time complexity given by the number of nodes in the levels being exchanged, i.e. the run time complexity is local. The simplest algorithm proposed (called "sifting") was to try all positions for each variable and keep the best one, one variable at a time. While this algorithm does not try all permutations, it tries a large number of them and is quite effective in improving the variable order. On the other hand, the algorithm is also quite slow because of its semi-exhaustive nature.

The present invention uses a slight variation on the sifting algorithm. In the BDDs used in the present invention for simulation, there is a restriction caused by the need to ensure that an output variable appears in the DBB order only after all the input variables in its support have appeared. This means it is necessary to restrict the variable permutations that the dynamic variable ordering algorithm can attempt. To impose this restriction, a matrix is maintained with output variables as columns and input variables as rows in which an element has the value 1 if the input corresponding to the row is in the transitive fanin of the output corresponding to the column. In the preferred implementation, the sifting algorithm checks this matrix before each swap to determine if one of the levels corresponds to an input, the other to an output and if the input is in the transitive fanin of the output. If the restriction would be violated by the swap, the sifting of the variable stops at that level. Using dynamic variable ordering in the present invention, it is possible to investigate not only different input variable orderings, but also different interleavings of the input and output variables. Even with the restriction, dynamic variable ordering results in fewer partitions, smaller sizes of the final binary and reduced simulation time in most cases. The main drawback of dynamic variable ordering is the increased BDD creation time.

Based on knowledge of the bench test, it is possible for the user to indicate to the simulator which subcircuits do not need to be evaluated for that bench test. For example, if all inputs to a subcircuit remain constant throughout the test bench, repeated evaluation of the outputs of that subcircuit would be wasteful. It is possible to make the simulator framework recognize this information and quickly regenerate the executable incorporating it. This basically involves regenerating the top-level routine so that the procedure corresponding to the appropriate subcircuit is not called, and relinking it with the remaining .o files.

The simulation time in the instruction-centric approach is largely determined by the number of branches required to compute the output values. If an analysis of the bench test reveals patterns in the input signals, it is possible to minimize the likelihood of branches being taken by reflecting that information in the generated code. For example if a variable takes the value 0 most of the time, it is possible to minimize the likelihood of a branch for this variable by making the program branch on 1 for this variable whenever there is a choice. The code can be quickly modified to reflect this information. This optimization can be very fast and transparent to the user since it is not necessary to remake the BDDs for this. This can either be come as a post processing step or during the code generation itself.

Retiming involves the redistribution of flip-flops in the circuit either to reduce clock-cycle time or to reduce the number of flip-flops, as described in an article by Charles E. Leiserson and James B. Saxe entitled "Retiming Synchronous Circuitry" in Algorithmica—An International Journal in Computer Science, pages 5–35, Volume 6, Number 1, 1991. This is usually done to reduce cycle time. This can either be performed automatically by a synthesis program, or manually by the designer. Usually, a reduction in the cycle-time by flip-flop redistribution is accompanied by an increase in the number of flip-flops. The simulation speed of the BDD-based method is affected by the increase in the number of flip-flops since its run time is directly proportional to the number of I/O variables in the combinational portion of the circuit. Alternatively, the circuit to be simulated can be retimed to minimize the number of flip-flops before being simulated using the present invention.

The following are partitioning strategies which will maximize simulation speed and minimize memory requirements for practicing the present invention.

The manner in which the design is partitioned can have a significant effect on the speed of simulation and the memory requirements. Separate characteristic functions are made for logic in different partitions. The outputs of one partition can be the inputs to another partition, thereby determining the order of evaluation. Or, the two partitions may have no dependence on each other and can be evaluated independently.

One strategy is to partition by leveraging the disjoint support. In this strategy two large blocks of logic with disjoint support should preferably be located in different partitions. Since the support is disjoint, the number of variables remains the same whether one partition is used or two partitions is used. As a result, evaluating the two separate characteristic functions requires the same amount of computation time as evaluating a single characteristic function encompassing both the blocks. The memory requirement is also the same for the two cases. The advantage of keeping the two blocks separate is that it allows greater flexibility during evaluation. For example, if there is no change from one cycle to the next in the inputs to one of the blocks, that block does not need to be re-evaluated. This flexibility is not available if both cones are placed in a single partition.

Another strategy is partitioning based on signal activity. If two blocks of logic have significantly different frequency of usage, they should be placed in different blocks of logic even if they have some common support. For example, two blocks in the ALU might receive inputs from the same set of registers, but might have completely different usage characteristics determined by the control inputs to the ALU. If the two blocks are placed in the same characteristic function, both blocks must be evaluated in each clock cycle. If a separate characteristic function is made for each block, then a block need only be evaluated when necessary. In this manner, the block with low usage does not have to be evaluated with the same frequency as the block with the high usage. Since the blocks have some common support, there is some overhead associated with making a separate characteristic function for each block. The user can guide this partitioning by providing a representative test vector set. With the design partitioned in this manner, the code generation and BDD creation effort can be concentrated on the block with the more frequent usage if compile time is an issue.

A further strategy is partitioning based on functional relationship between signals. An obvious example in this situation is a multiplexor. Given a two input multiplexor, with control input C, and data inputs A and B, it is known that given a value for C, only one of A or B will be used. This mutual exclusiveness in the usage of A and B can be used to advantage during simulation by appropriate partitioning and ordering of evaluations. First, place the blocks of logic evaluating C, A and B in different characteristic functions. During simulation, first evaluate the characteristic function for C. Depending on the value of C, then evaluate either A or B. If the support for the blocks of logic feeding A and B is exactly the same, then exploiting this mutual exclusiveness allows achievement of the same performance as in the unpartitioned case but with a lower cost in memory usage. If the supports are different, then exploiting the mutual exclusiveness has the potential of making the simulation run much faster. Mutual exclusiveness is only one form of dependence that can be exploited.

Another example of the use of signal relationships is the case of two blocks of logic converging at, for example, an AND gate. If the probability that one of the two blocks of logic produces a 0 is very high, it might be beneficial to make separate characteristic functions for the two blocks and to evaluate the block of logic that is extremely likely to produce a 0 first. The second block of logic now needs to be evaluated only in the infrequent event of the first block producing a 1. The user can potentially guide such partitioning in an interactive manner. Or the partitioning can be done automatically by extracting relevant information from an RT level description of the design, by trying to detect multiplexors by pattern matching on the gate-level description of the design, or by a logical and signal activity analysis of the gate-level description of the design.

Such partitioning is also applicable in designs (e.g., processors) with a clear flow of information. For such designs, the partitioning should mimic the block-diagram of the design, and the order in which the blocks are simulated should mimic the information flow in the design.

While there has been described and illustrated an enhanced binary decision diagram based functional simulation and variations and modifications thereof, it will be apparent to those skilled in the art that further variations and modifications are possible without deviating from the broad principles and teachings of the invention which shall be limited solely by the scope of the claims appended hereto.

What is claimed is:

1. A method of generating assembly code from a BDD-based characteristic function of a circuit for functional simulation of the circuit comprising the steps of:

generating a BDD model of a circuit to be functionally simulated, said BDD model having nodes, including input variable nodes and output variable nodes, said input variable nodes having respective input variable values and child nodes;

translating said BDD model directly into said assembly code;

wherein said translating includes:

for each of said input variable nodes, generating assembly code for
fetching said respective input variable value,
testing the fetched value, and
branching to a statement corresponding to said respective child node depending upon said fetched value.

2. The method of generating assembly code as set forth in claim 1, further comprising:

for each of said output variable nodes, generating assembly code for:
storing a respective output variable value, and
branching to a statement corresponding to a next one of said nodes.

3. The method of generating assembly code as set forth in claim 2, further comprising storing said variable values in a global data structure in the form of an array.

4. The method of generating assembly code as set forth in claim 3, wherein a register stores a base address of said array while said assembly code is generated.

5. The method of generating assembly code as set forth in claim 4, further comprising storing of said variable values by using only a single instruction using said base address stored in said register.

6. The method of generating assembly code as set forth in claim 5, further comprising storing a variable in a delay slot of a branch leading to the code for the node.

7. The method of generating assembly code as set forth in claim 6, wherein a label corresponding to said branch is determined at compile time.

8. The method of generating assembly code as set forth in claim 4, wherein said assembly code for fetching is only a single instruction using said base address stored in said register.

9. The method of generating assembly code as set forth in claim 8, wherein said assembly code for fetching said variable is in a delay slot of a branch leading to the code for the node.

10. The method of generating assembly code as set forth in claim 3, wherein the ordering of variables in different partitions is independent of each other and the code runs without run time overhead by virtue of the determination of the array index of the variable at compile time.

11. The method of generating assembly code as set forth in claim 10, wherein the output of a first partition is an input to a second partition and the code runs without run time overhead by virtue of the determination of the array index of the variable at compile time.

12. The method of generating assembly code as set forth in claim 3, wherein the ordering of variables is noncontiguous for successive nodes in the BDD and the code runs without run time overhead by virtue of the determination of the array index of the variable at compile time.

13. The method of generating assembly code as set forth in claim 3, wherein the ordering of input variables and output variables is interleaved and the code runs without run time overhead by virtue of the determination of the array index of the variable and the determination of whether the variable is an input variable or an output variable at compile time.

14. The method of generating assembly code as set forth in claim 3, wherein the code for a child node is emitted contiguously with the code for the current node thereby obviating one of the branches from the node.

15. The method of generating assembly code as set forth in claim 14, wherein the node emitted contiguously is a child node which corresponds to the value taken most often by the variable.

16. The method of generating assembly code as set forth in claim 3, further comprising modifying generated assembly code so that sections of assembly code corresponding to nodes that are stored contiguous to each other are reordered based upon input vector data.

17. The method of generating assembly code as set forth in claim 3, wherein the BDD model is generated using dynamic variable ordering from which assembly code is generated further comprising moving variables up and down the variable order according to a sifting algorithm, unless a pair of variables to be swapped correspond to an output variable and an input variable in its support respectively.

18. The method of generating assembly code as set forth in claim 3, further comprising retiming the circuit to reduce the number of flip-flops to reduce the number of input/output variables prior to generating the BDD model.

19. The method of generating assembly code as set forth in claim 2, further comprising:

partitioning said BDD model into a plurality of partitions;
placing blocks of logic with disjoint support into separate ones of said plurality of partitions; and
evaluating said partitions only when necessary.

20. The method of generating assembly code as set forth in claim 2, further comprising:

partitioning said BDD model into a plurality of partitions;
placing blocks of logic with differing frequencies of use into separate ones of said plurality of partitions; and
evaluating said separate partitions only when necessary.

21. The method of generating assembly code as set forth in claim 2, further comprising:

partitioning said BDD model into a plurality of partitions;
placing blocks of logic not concurrently needed into alternative ones of said plurality of partitions;
placing a block of logic that determnines which of the logic blocks is needed into a separate one of said plurality of partitions; and
evaluating one of said alternative partitions responsive to an output from said separate partition.

* * * * *